(12) United States Patent
Pope et al.

(10) Patent No.: US 10,546,649 B2
(45) Date of Patent: Jan. 28, 2020

(54) POST PACKAGE REPAIR FOR MAPPING TO A MEMORY FAILURE PATTERN

(71) Applicant: HEWLETT PACKARD ENTERPRISE DEVELOPMENT LP, Houston, TX (US)

(72) Inventors: Eric L Pope, Tomball, TX (US); Scott P Faasse, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 43 days.

(21) Appl. No.: 15/753,315

(22) PCT Filed: Aug. 18, 2015

(86) PCT No.: PCT/US2015/045683
§ 371 (c)(1),
(2) Date: Feb. 18, 2018

(87) PCT Pub. No.: WO2017/030564
PCT Pub. Date: Feb. 23, 2017

(65) Prior Publication Data
US 2018/0247699 A1    Aug. 30, 2018

(51) Int. Cl.
*G11C 29/00* (2006.01)
*G11C 29/10* (2006.01)
*G11C 29/24* (2006.01)
*G11C 29/44* (2006.01)

(52) U.S. Cl.
CPC ............. *G11C 29/76* (2013.01); *G11C 29/10* (2013.01); *G11C 29/24* (2013.01); *G11C 29/44* (2013.01); *G11C 2029/4402* (2013.01)

(58) Field of Classification Search
CPC ..... G11C 29/24; G11C 29/44; G11C 29/4401; G11C 29/70; G11C 29/76; G11C 29/808; G11C 29/006
See application file for complete search history.

(56) References Cited

U.S. PATENT DOCUMENTS

| 4,296,494 | A | 10/1981 | Ishikawa et al. |
| 4,939,694 | A | 7/1990 | Eaton et al. |
| 5,469,390 | A | 11/1995 | Sasaki et al. |
| 5,640,236 | A | 6/1997 | Acosta et al. |
| 5,936,970 | A | 8/1999 | Lee |
| 6,018,482 | A * | 1/2000 | Fujita ................... G11C 29/808 365/200 |
| 6,141,267 | A | 10/2000 | Kirihata et al. |
| 6,154,851 | A | 11/2000 | Sher et al. |
| 6,282,689 | B1 | 8/2001 | Seyyedy |

(Continued)

OTHER PUBLICATIONS

Intel® 6400/6402 Advanced Memory Buffer, Datasheet, Oct. 2006, 250 pages.

(Continued)

*Primary Examiner* — Shelly A Chase
(74) *Attorney, Agent, or Firm* — Hewlett Packard Enterprise Patent Department

(57) ABSTRACT

In one example in accordance with the present disclosure, a method includes mapping, using post-package repair, an address associated with a first memory row of a computing device to a spare memory row of the computing device, wherein the spare memory row has a memory failure pattern, and reading data from the spare memory row.

20 Claims, 8 Drawing Sheets

(56) References Cited

U.S. PATENT DOCUMENTS

| | | |
|---|---|---|
| 6,704,228 B2 | 3/2004 | Jang et al. |
| 7,263,019 B2 | 8/2007 | Nierle et al. |
| 7,441,060 B2 | 10/2008 | Gower et al. |
| 7,839,707 B2 | 11/2010 | Aakjer |
| 7,948,818 B1 | 5/2011 | Wu et al. |
| 7,996,710 B2 | 8/2011 | Nagaraj et al. |
| 8,509,014 B2 | 8/2013 | Shvydun et al. |
| 8,601,330 B2 | 12/2013 | Jeong et al. |
| 8,670,283 B2 | 3/2014 | Ong et al. |
| 8,861,277 B1 | 10/2014 | Rategh et al. |
| 8,885,426 B1 | 11/2014 | Burstein et al. |
| 9,087,615 B2 | 7/2015 | Cordero et al. |
| 9,165,679 B2 | 10/2015 | Oh et al. |
| 9,349,491 B1* | 5/2016 | Morgan ................. G11C 29/76 |
| 9,558,851 B2* | 1/2017 | Wilson .................. G11C 29/70 |
| 2004/0015754 A1* | 1/2004 | Callaway ............. G11C 29/006 714/719 |
| 2004/0246774 A1 | 12/2004 | Van Brocklin et al. |
| 2005/0028038 A1 | 2/2005 | Pomaranski et al. |
| 2006/0036921 A1 | 2/2006 | Callaway et al. |
| 2006/0064618 A1 | 3/2006 | Wu et al. |
| 2007/0058470 A1 | 3/2007 | Nierle et al. |
| 2007/0133323 A1 | 6/2007 | Kim et al. |
| 2008/0304347 A1 | 12/2008 | Kenkare et al. |
| 2009/0190422 A1 | 7/2009 | Khoja et al. |
| 2009/0217093 A1 | 8/2009 | Co |
| 2011/0228614 A1 | 9/2011 | Shaeffer et al. |
| 2011/0280091 A1 | 11/2011 | Rooney et al. |
| 2011/0296258 A1 | 12/2011 | Schechter et al. |
| 2012/0030509 A1 | 2/2012 | Wood et al. |
| 2012/0266016 A1 | 10/2012 | Huang |
| 2013/0010557 A1 | 1/2013 | Rooney et al. |
| 2013/0021859 A1 | 1/2013 | Shvydun et al. |
| 2013/0070547 A1 | 3/2013 | Pyeon |
| 2013/0176768 A1 | 7/2013 | Wang |
| 2013/0223171 A1 | 8/2013 | Kim et al. |
| 2014/0003173 A1 | 1/2014 | Ku |
| 2014/0078842 A1 | 3/2014 | Oh et al. |
| 2016/0350191 A1 | 12/2016 | Chen |

OTHER PUBLICATIONS

International Search Report and Written Opinion of the International Searching Authority dated Jun. 28, 2016; International Application No. PCT/US2015/045683; 9 pages.

International Search Report and Written Opinion, dated Jan. 27, 2015, PCT/US2014/039622, 11 Pages.

Jae-Kyung Wee, "Antifuse Circuits and Their Applications to Post-Package of DRAMs", Journal of Semiconductor Technology and Science, vol. 1. No. 4, Dec. 2001, 16 pages.

Wada, O. et al., Post-packaging Auto Repair Techniques for Fast Row Cycle Embedded DRAM, (Research Paper), Jul. 16, 2004, 8 Pages.

Yung-Fa Chou et al, Reactivation of Spares for off-Chip Memory Repair After Die Stacking in a 3-D IC With TSVs, In: IEEE Transactions on Circuits and Systems-I: Sep. 9, 2019, pp. 2343-2351.

Lu et al., "Efficient Built-in Redundancy Analysis for Embedded Memories with 2-D Redundancy", (Research Paper), May 10, 2005, 5 pages.

\* cited by examiner

POST PACKAGE REPAIR FOR MAPPING TO A MEMORY FAILURE PATTERN

BACKGROUND

Newer memories, such as double data ram version 4 (DDR4) include so-called post-package repair (PPR) capabilities. PPR capabilities enable a compatible memory controller to remap accesses from a faulty row of a memory module to a spare row of the memory module that is not faulty.

BRIEF DESCRIPTION OF THE DRAWINGS

The following detailed description references the drawings, wherein.

DETAILED DESCRIPTION

Figure 1:
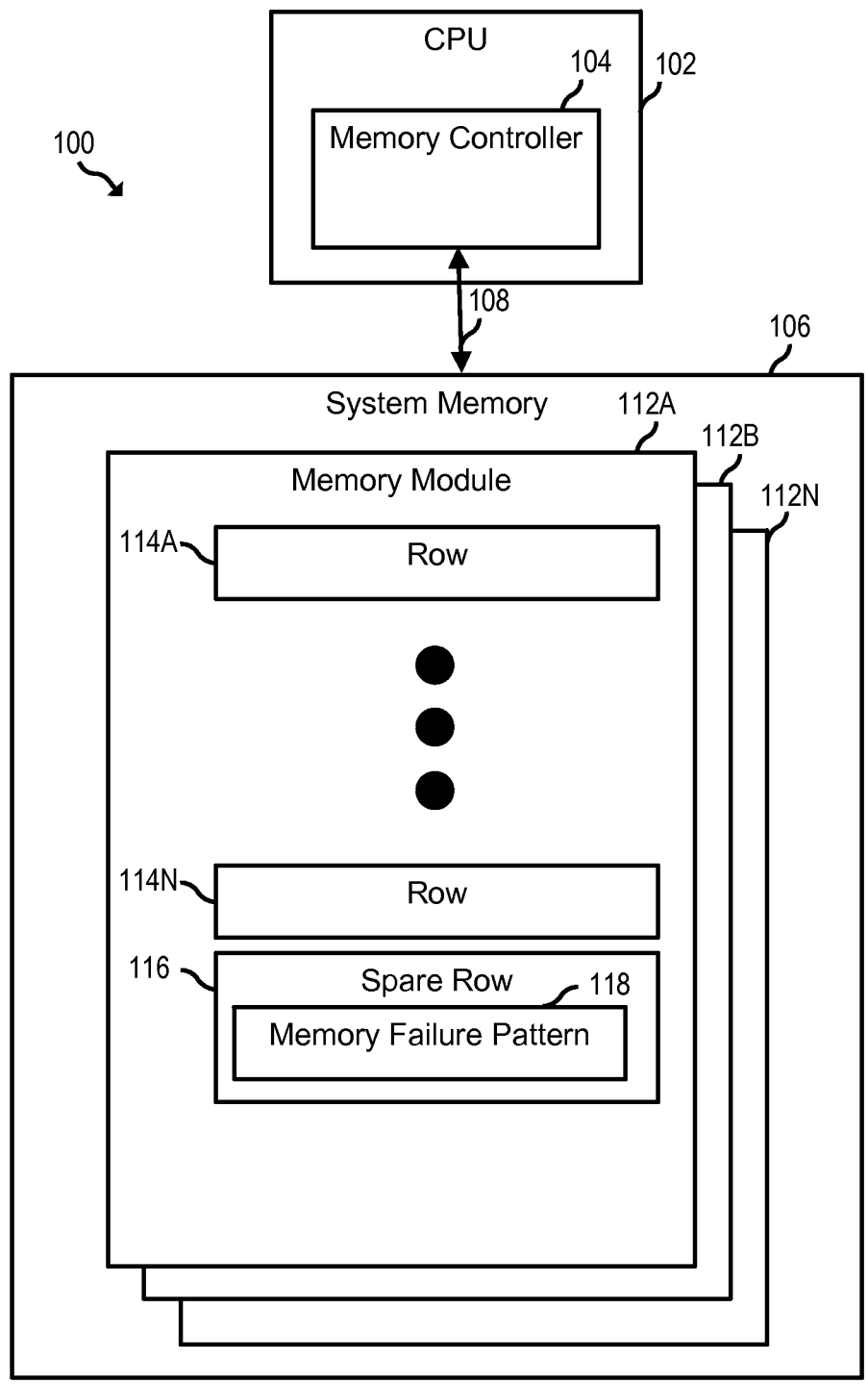
FIG. 1 is a block diagram of an example computing system that includes post-package repair technology.

Computing devices include various types of synchronous dynamic random access memory (SDRAM), such as double data rate (DDR) SDRAM. As the capacity of DDR SDRAM included in computing devices has grown, so too has the failure rate of DDR SDRAM modules. DDR SDRAM modules are referred to as DIMMs (Dynamic Inline Memory Modules).

Each DIMM comprises at least one memory chip. Each memory chip comprises rows and columns of dynamic RAM cells. A memory controller, which is coupled to a processor, such as a CPU, and/or GPU, issues memory transfer requests to read or write data to or from a particular address of a DIMM. The memory controller may also issue other non-data transfer commands to a DIMM, such as PPR commands.

When processing a memory transfer request associated with a particular address, the memory controller determines a DIMM that is associated with the address. The Memory controller also determines as well as a column address, and a row address of the DIMM that are associated with the address. To read or write data at the designated row and column, the memory controller applies an address signal to indicate a designated row and column of the DIMM to access.

DIMMs may have faulty rows, columns, chips, banks, or even for entire DIMMs to be faulty. Some of the faults may be transient (temporary) while other faults may be permanent. To address transient and non-transient memory failures, DDR4 DIMMs include so-called "post-package repair" (PPR) capability. Based on ECC data within a word, a memory controller may detect permanent or transient errors. PPR allows a compatible memory controller to remap the faulty row to a spare row.

The DDR4 standard defines two types of PPR remapping capabilities, referred to as "hard-PPR" and "soft-PPR." Hard-PPR permanently remaps accesses from a designated faulty row to a designated spare row. A Hard-PPR row remapping survives power cycles. Soft-PPR remapping temporarily maps accesses from a faulty row to a designated spare row. A Soft-PPR row remapping will survive a "warm" reboot, but does not survive a power cycle.

Some techniques of this disclosure enable a memory controller to perform fault injection and testing of memory modules using hard- and/or soft-PPR capabilities of DRAM modules. A memory controller configured according to this disclosure may use PPR to remap memory transfer requests from a first row of a memory module to a designated spare row that is configured to have a particular memory failure pattern.

To ensure that the memory controller appropriately detects, and responds to failures, the memory controller may read from the spare row having the failure pattern. Based on how the memory controller reacts to the failure pattern, a processor or other testing hardware may validate that memory controller's error correction, and PPR capabilities work as intended. For example, a test system that includes a processor may compare a memory controller's execution in response to at least one failure pattern to previously-generated model test execution patterns for the same memory failure patterns. The test system may validate the memory controller's fault handling capability based on whether or not the memory controller's execution matches the previously-determined execution for the at least one failure pattern.

By using PPR-based fault injection as described herein, the techniques of this disclosure achieve several improvements. The techniques of this disclosure use existing PPR technology, which is already built-in to some DRAM modules. The techniques of this disclosure thus requiring minimal modification of memory modules. Some previous techniques for detecting memory errors modified the memory controller specifically for performing testing. Such modifications introduced greater potential for memory controller malfunction. Additionally, such modifications had to be designed specifically for each hardware vendor's chipset. The techniques of this disclosure work with any PPR-compatible memory controller regardless of the underlying memory controller architecture, thereby reducing complexity.

Some techniques for performing fault injection and memory controller validation used known-failing memory modules. Such failing memory modules had a single failed address, so a test system could not validate a memory controller's response to failures across a large address range. Additionally, such failing memory modules could act non-deterministically and unreliably. The techniques of this disclose enable a test system to validate a memory controller's response to memory failures over a broad (or even the entire) memory address range.

Additionally, because techniques did not allow a memory controller to inject a particular failure pattern into a row, these techniques could not provide that errors will be correctable or uncorrectable. The techniques of this disclosure also enable a computing device to inject a particular failure pattern. By enabling a memory controller to inject a particular failure pattern into a spare row, a computing system may test a memory controller's response to both correctable and uncorrectable errors while also maintaining deterministic memory module behavior.

FIG. 1 is a block diagram of an example computing system 100. Computing system 100 comprise a system for validating memory controller 104, and may include a central processing unit (CPU) 102. CPU 102 is illustrated as a single CPU for the purpose of example. In various examples, CPU 102 may comprise a plurality of CPUs. CPU 102 may further include memory controller 104. Memory controller 104 is illustrated as being integrated in CPU 102 in FIG. 1. However, memory controller 104 may be discrete from CPU 102 in various examples.

Computing system 100 also includes system memory 106. Memory controller 104 and system memory 106 may be coupled with a memory bus 108. Memory bus 108 may comprise a data and/or memory bus. System memory 106 may comprise one or more memory modules, such as memory module 112A-112N ("memory modules 112"). Memory modules 112 may comprise DDR4 modules or any other type of memory module that includes PPR capability.

Each of memory modules 112 includes a plurality of rows. For example, memory module 112A includes rows 114A-114N ("rows 114"). In addition to rows 114, memory module 112A includes a spare row 116. Spare row 116 is illustrated as a single row for the purpose of example, and may comprise a plurality of spare rows in various examples.

Spare row 116 may include a memory failure pattern 118 in various examples. A memory failure pattern may comprise one or more "stuck-at faults." Stuck-at faults as described herein are bits that have a fixed value, and do not change if written-to. For example, memory failure pattern may comprise a data word that includes one or more stuck-at 1's or stuck-at 0's. A stuck-at 1 value does not change from a one to a zero even if a zero is written to that bit. A stuck-at 0 value does not change from a zero to a one even if a one is written to that bit.

According to the techniques of this disclosure, memory controller 104 may be configured to use either soft- or hard-post PPR to remap a first row of one of rows 114 to spare row 116, having a particular memory failure pattern 118. By remapping one of rows 114 to row 116 having memory failure pattern 118, computing system 100 may test and/or validate the behavior of memory controller 104 in response to memory failure pattern 118.

Figure 2:
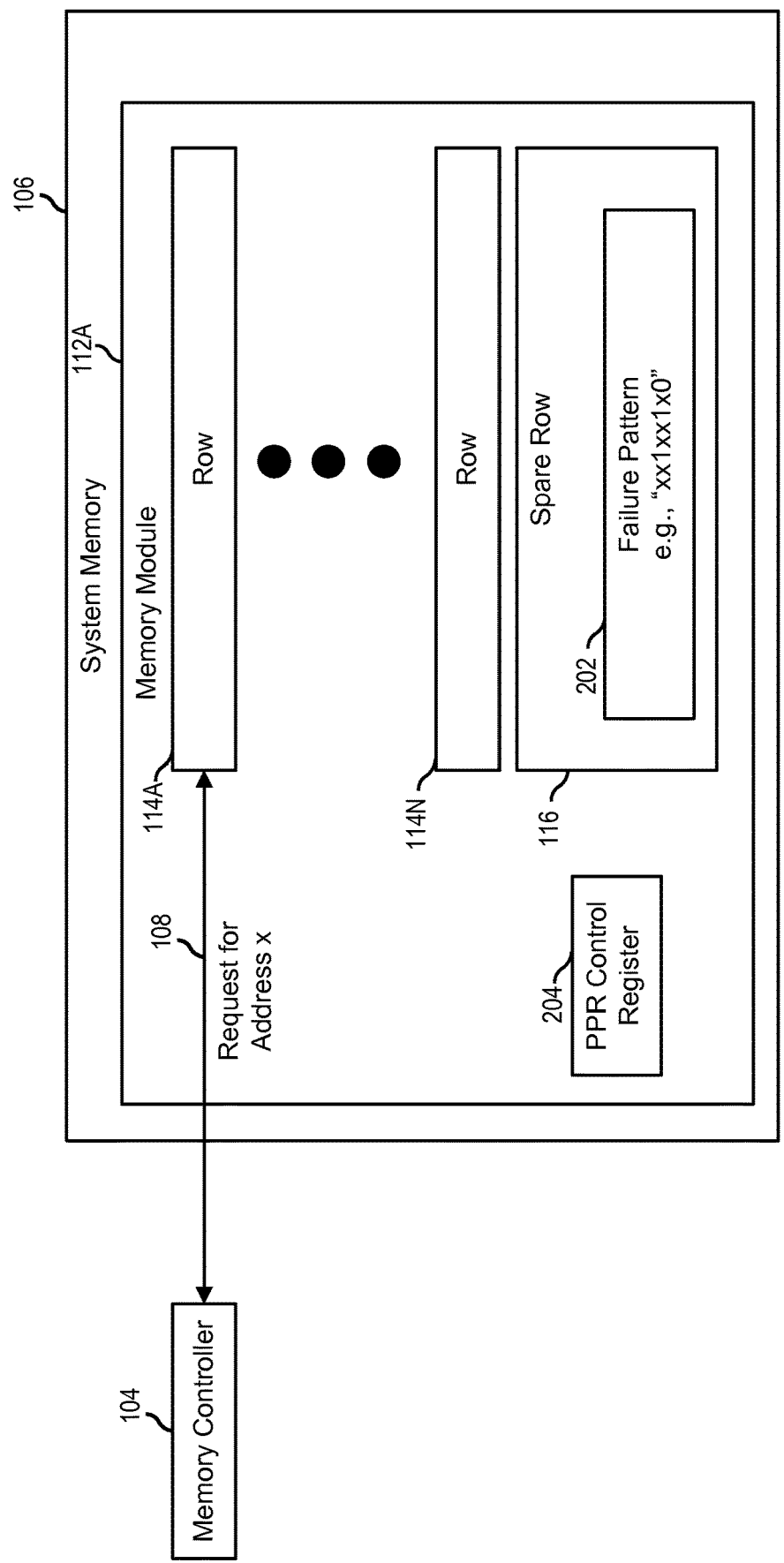
FIG. 2 is a block diagram of an example system memory that includes fault injection capability using post-package repair technology.

FIG. 2 is a block diagram of an example system memory that includes fault injection capability using post-package repair technology. FIG. 2 includes memory controller 104, and system memory 106. Memory controller 104 and system memory 106 are coupled via memory bus 108. System memory 106 comprises one or more memory modules 112 that include hard- and/or soft-PPR capability. Each of memory modules 112 includes a plurality of rows. For example, memory module 112A includes rows 114A-114N ("rows 114"). In addition to rows 114, memory module 112A includes a spare row 116.

In the example of FIG. 2, spare row 116 includes a failure pattern 202. Failure pattern 202 comprises an 8-bit failure pattern comprising two stuck-at one bits, and one stuck-at zero bit. The "x's" within failure pattern 202 indicate bits that are not stuck at a particular value. Failure pattern 202 may comprise any number of stuck bits and/or bits fixed to a particular value within spare row 116.

In the example of FIG. 2, memory controller 104 receives a transfer request for a particular memory address x, and decodes the request. As part of decoding the request for address x, memory controller 104 determines that the memory address is associated with a row and a column of memory module 112A.

In the example of FIG. 2, memory controller 104 determines the request for address x maps to row 114A of memory module 112A. In this example, memory control module 112A holds spare row 116 in reserve, and does not use spare row 116. To perform the transfer request, memory controller 104 sends a row address, opens a page with a given row address, and accesses a column within that row of memory module 112A. Memory controller 104 then reads and/or writes any data to the data word located indicated by the row 114A and the designated column of memory module 112A.

Figure 3:
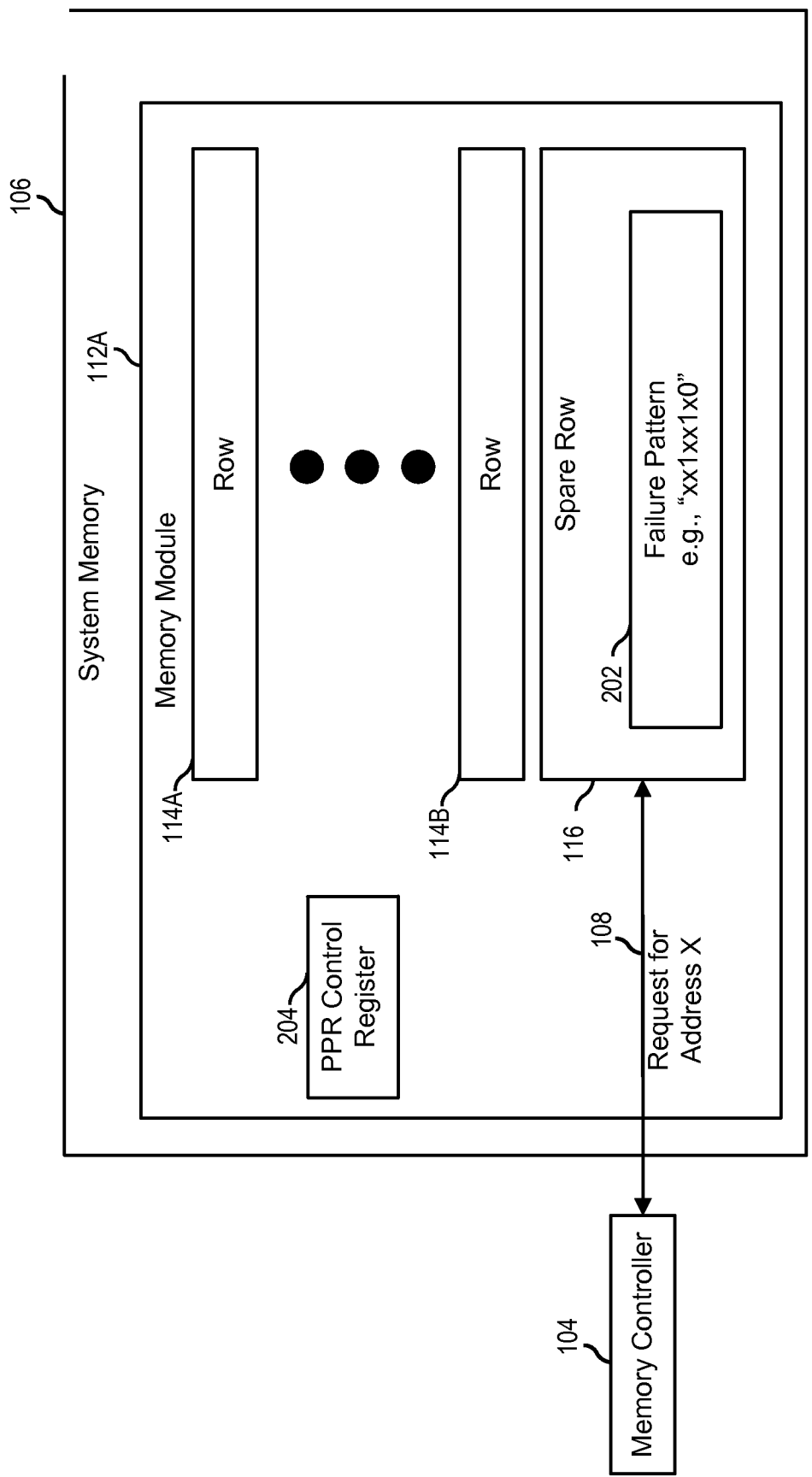
FIG. 3 is a block diagram of an example system memory that includes fault injection capability using post-package repair technology.

FIG. 3 is a block diagram of an example system memory that includes fault injection capability using post-package repair technology. In FIG. 3, memory controller 104 receives a transfer request for the same memory address x as described above with respect to FIG. 2. However, in FIG. 3, memory controller 104 has remapped the row associated with address x from row 114A, to to spare row 116, which includes failure pattern 202.

To remap row 114A to spare row 116, memory controller 104 issues at least one command to PPR control register 204. PPR control register 204 is a register within memory module 112A. PPR control register 204 controls the PPR remapping functionality of memory module 112A. PPR module 204 receives a command indicating a row that is to be remapped (e.g., row 114A), and/or data indicating the spare replacement row (spare row 116 in this example) that replaces the row to be remapped. Responsive to PPR control register 204 receiving a PPR remapping command, memory module 112A remaps accesses to row 114A to spare row 116.

Responsive to remapping row 114A to spare row 116, a processor, such as CPU 102, issues transfer requests to memory controller 104 to determine how memory controller 104 responds to various failure patterns. As an example, CPU 102 may issue transfer requests for memory address x, which has been remapped to be associated with spare row 116. The transfer request may cause memory controller 104 to write a particular value to spare row 116. However, as indicated above, spare row 116 includes failure pattern 202, which includes a number of stuck-at bits. Due to the stuck-at bits of failure pattern 202, during a write request, memory controller 104 is unable to change the values of the stuck-at bits of failure pattern 202.

Memory controller 104 and memory module 112A may include error correcting code (ECC) capability in some examples. For each word of data stored in memory module 112A, memory module 112A also includes additional bits used to store ECC data for that word. Memory controller 104 calculates the values of the ECC bits for each word during a write operation. Memory controller 104 uses the ECC bits to verify correctness of the data word during a read operation.

To validate memory controller 104, CPU 102 issues a memory transfer request at address x, which causes memory controller 104 to read from spare row 116. During a read, memory controller 104 may determine whether a correctable or an uncorrectable error is present based on the data read from spare row 116, as well as the additional ECC bits. Memory controller 104 records the occurrence of single-bit (correctable) or multiple-bit (uncorrectable) errors. If memory controller 104 detects a correctable error, memory controller 104 corrects the error.

CPU 102 may generate memory reads and writes patterns that are known to differ relative to memory failure pattern 118. As an example, CPU 102 may generate memory reads and writes that differ from memory failure pattern 118 by a single bit to test whether the ECC functionality of memory controller 104 properly corrects these one-bit errors. Similarly, memory controller 104 may generate errors that are known not to be correctable to ensure that memory controller 104 does not attempt to correct such errors, and to test whether memory controller 104 detects such errors as being uncorrectable.

CPU 102 or another processor may also issue transfer requests to spare row 116 to test the PPR functionality of memory controller 104. As an example, CPU 102 or another processor may issue a transfer request at address x corresponding to failure row 116. CPU 102 may issue the transfer requests in such a way so as to cause memory controller 104 to determine that spare row 116 has failed.

For example, CPU 102 may configure failure pattern 202 to be uncorrectable by setting a failure pattern and issuing a write request that varies by more than one bit relative to the failure pattern. CPU 102 may then issue multiple read requests to spare row 116 so as to cause memory controller 104 to identify repeated uncorrectable read failures. Memory controller 104 may determine that spare row 116 has failed once a threshold number of uncorrectable transfer operations have occurred in some examples.

Based on the determination that spare row 116 has failed, memory controller 104 may issue at least one command to PPR control register 204 to remap spare row 116, e.g. to another spare row using either hard- or soft-PPR functionality. In some examples, memory controller 104 may decide whether to use hard-PPR or soft-PPR row remapping to correct memory failure patterns based on the number of failed memory transfers, and/or the type (e.g., read or write) transfers, and whether the memory transfer errors were correctable.

Figure 4:
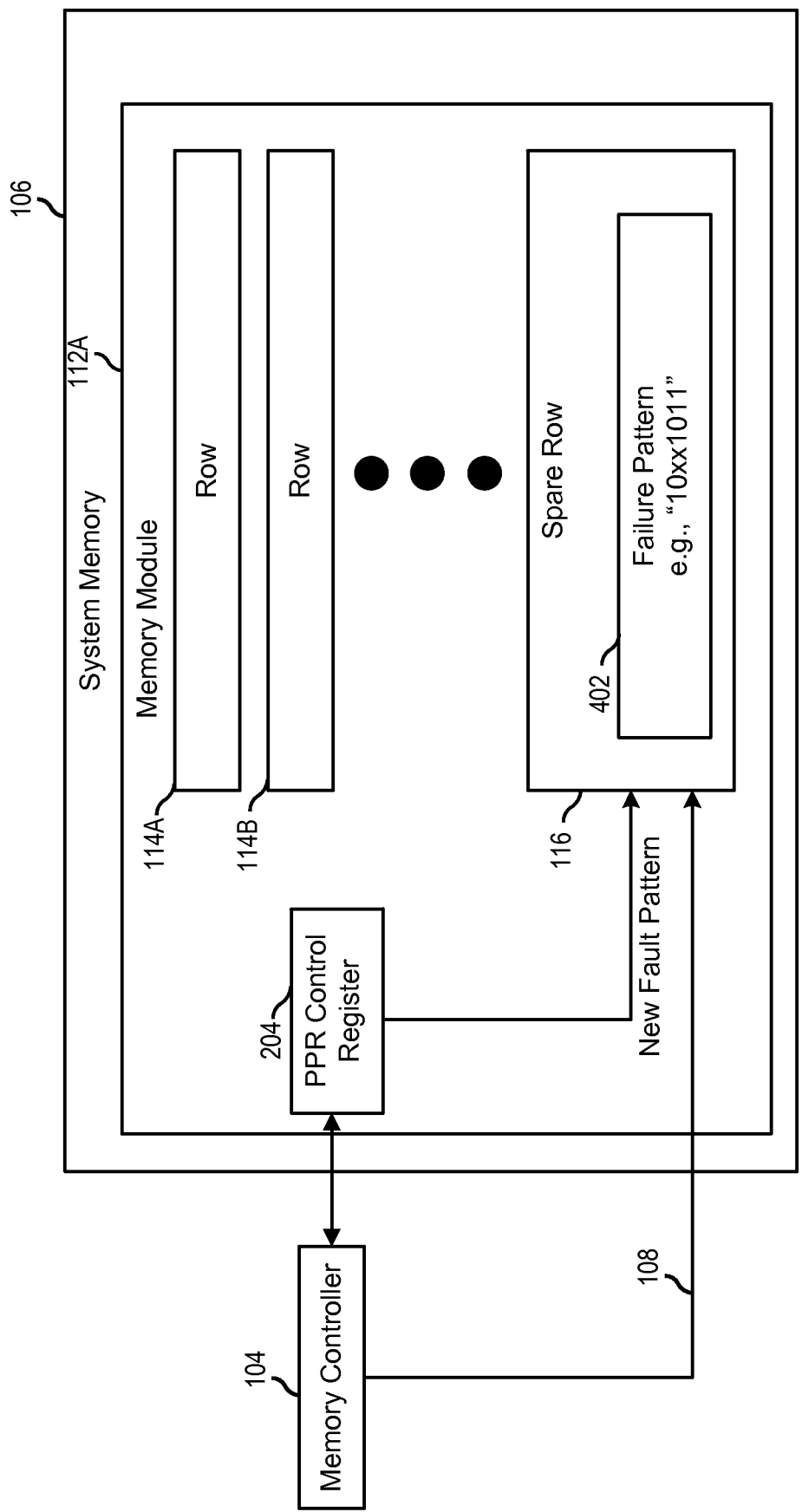
FIG. 4 is a block diagram of an example of changing a memory failure pattern in a spare row of system memory using post-package repair technology.

FIG. 4 is a block diagram of an example of changing a memory failure pattern in a spare row of system memory using post-package repair technology. In the example of FIG. 4, memory controller 104 transmits data to PPR control register 204. Responsive to receiving the data, PPR control register 204 may change failure pattern 202 of spare row 116.

To change the failure pattern, memory controller 104 may transmit a command to PPR control register 204. The command may indicate that memory controller 204 is supplying a new fault pattern to PPR control register 204. In the example of FIG. 4, the new failure pattern is "10xx1011." Responsive to receiving the failure pattern, PPR control register 204 updates failure pattern 402 with the value "10xx1011," which includes three stuck-at one bits, and two stuck-at zero bits. Although failure pattern 402 includes 8 bits, it should be understood that failure pattern 402 may comprise any number of bits (e.g., 32 or 64 bits). In some examples, responsive to transmitting a command to PPR control register 204, memory controller 104 may transmit new failure 402 pattern to spare row 116 via memory bus 108.

By signaling PPR control register 204, the techniques of this disclosure enable a processor to test and validate the response of memory controller 104 to a particular failure pattern against a predetermined response. For example, system 100 may set failure pattern 118 to a particular failure pattern for which system 100 has previously determined response data for that failure pattern. CPU 102 may compare the response of memory controller 104 to the failure pattern with the predetermined response data to determine whether or not memory controller 104 is functioning properly.

In FIG. 4, memory controller 104 receives a request for the same memory address x as described above with respect to FIG. 2. However, in FIG. 3, memory controller 104 has remapped the row associated with address x from row 114A, to spare row 116, which includes failure pattern 202.

In some examples, CPU 102 may cause memory controller 104 to change the address associated with spare row 116 from a first address to a second, different address. In some examples, CPU 102 may cause memory controller to associate spare row 116 associated with an address range (e.g. a starting and ending address range) or a plurality of address ranges. The address range(s) may be indicated by a command to PPR register 204.

Figure 5:
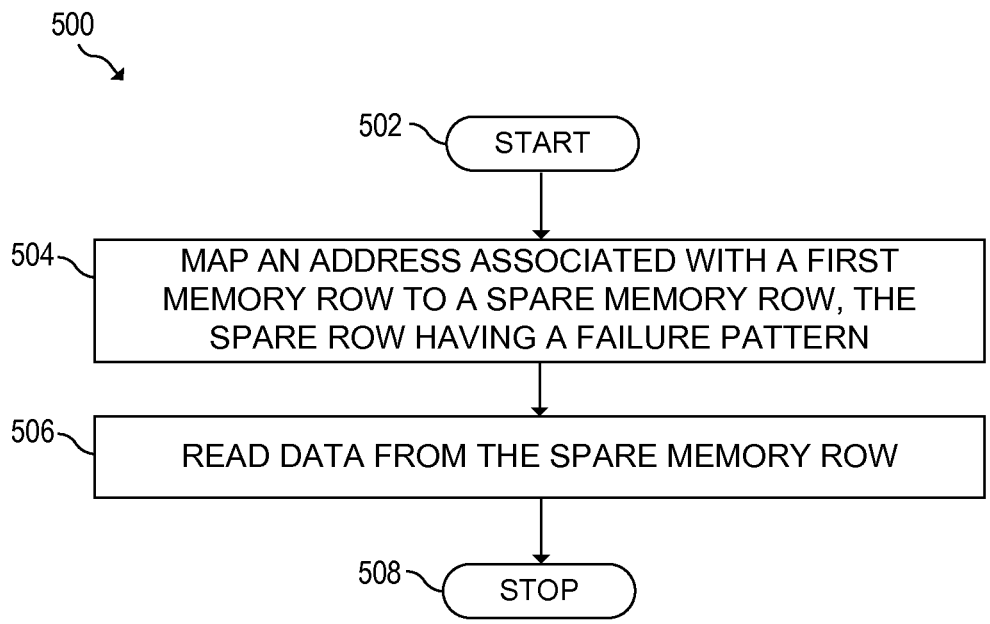
FIG. 5 is a flowchart of an example method for performing fault injection using post-package repair technology.

FIG. 5 is a flowchart of an example method for performing fault injection using post-package repair technology. Method 500 may be described below as being executed or performed by a system, for example, system 100 of FIG. 1. Other suitable systems and/or computing devices may be used as well. Method 500 may be implemented in the form of executable instructions stored on at least one machine-readable storage medium of the system and executed by at least one processor of the system. Alternatively or in addition, method 500 may be implemented in the form of electronic circuitry (e.g., hardware). In alternate examples of the present disclosure, one or more blocks of method 500 may be executed substantially concurrently or in a different order than shown in FIG. 5. In alternate examples of the present disclosure, method 500 may include more or fewer blocks than are shown in FIG. 5. In some examples, one or more of the blocks of method 500 may, at certain times, be ongoing and/or may repeat.

Method 500 may start at block 502 and continue to block 504, where the system may map an address associated with a first memory row of a computing device to a spare memory row of the computing device. The spare memory row may have a memory failure pattern. At block 506, the system may read (e.g., via memory controller 104) data from the spare memory row. Method 500 may eventually continue to block 508, where method 500 may stop.

Figure 6:
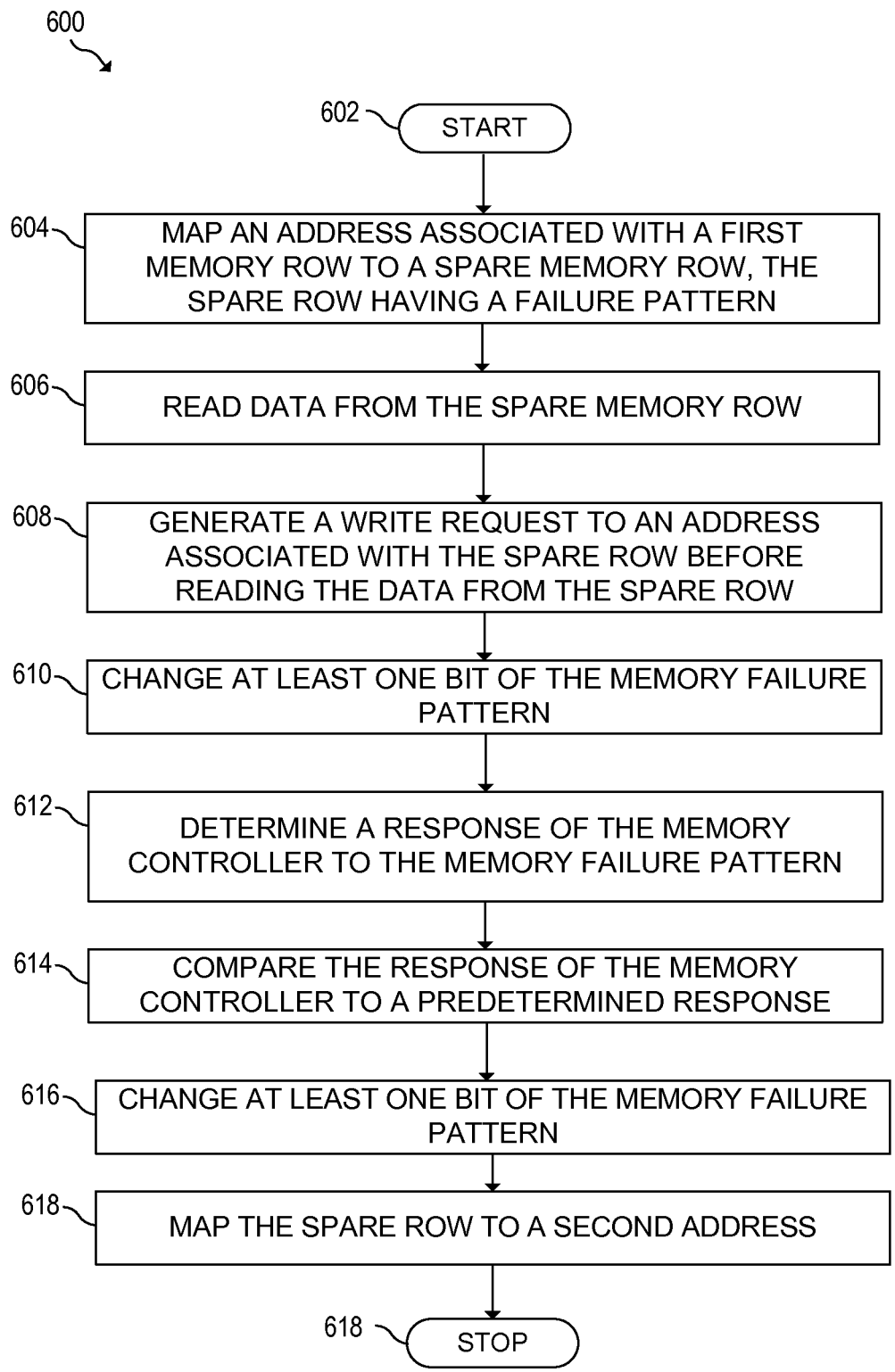
FIG. 6 is a flowchart of an example method for performing fault injection using post-package repair technology.

FIG. 6 is a flowchart of an example method for performing fault injection using post-package repair technology. Method 600 may be described below as being executed or performed by a system, for example, system 100 of FIG. 1. Other suitable systems and/or computing devices may be used as well. Method 600 may be implemented in the form of executable instructions stored on at least one machine-readable storage medium of the system and executed by at least one processor of the system. Alternatively or in addition, method 600 may be implemented in the form of electronic circuitry (e.g., hardware). In alternate examples of the present disclosure, one or more blocks of method 600 may be executed substantially concurrently or in a different order than shown in FIG. 6. In alternate examples of the present disclosure, method 600 may include more or less blocks than are shown in FIG. 6. In some examples, one or more of the blocks of method 600 may, at certain times, be ongoing and/or may repeat.

Method 600 may start at block 602 and continue to block 604, where the system may map an address associated with a first memory row of a computing device to a spare memory row of the computing device. The spare memory row may have a memory failure pattern. At block 606, the system may read (e.g., via memory controller 104) data from the spare memory row.

At block 608, in some examples, memory controller 104 may generate a write request to an address associated with the row having the memory failure pattern before reading the data from the spare memory. At block 610, memory controller 104 may change at least one bit of the memory failure pattern.

At block 612, in some examples, CPU 102 may determine a response of memory controller 104 to memory failure pattern 118, and at block 614, may compare the response of memory controller 104 to predetermined response to memory failure pattern 118.

At block 616, memory controller 104 may change at least one bit of memory failure pattern 118. At block 618, memory controller 104 may map spare row 116 to a second address. Method 600 may eventually continue to block 618, where method 600 may stop.

Figure 7:
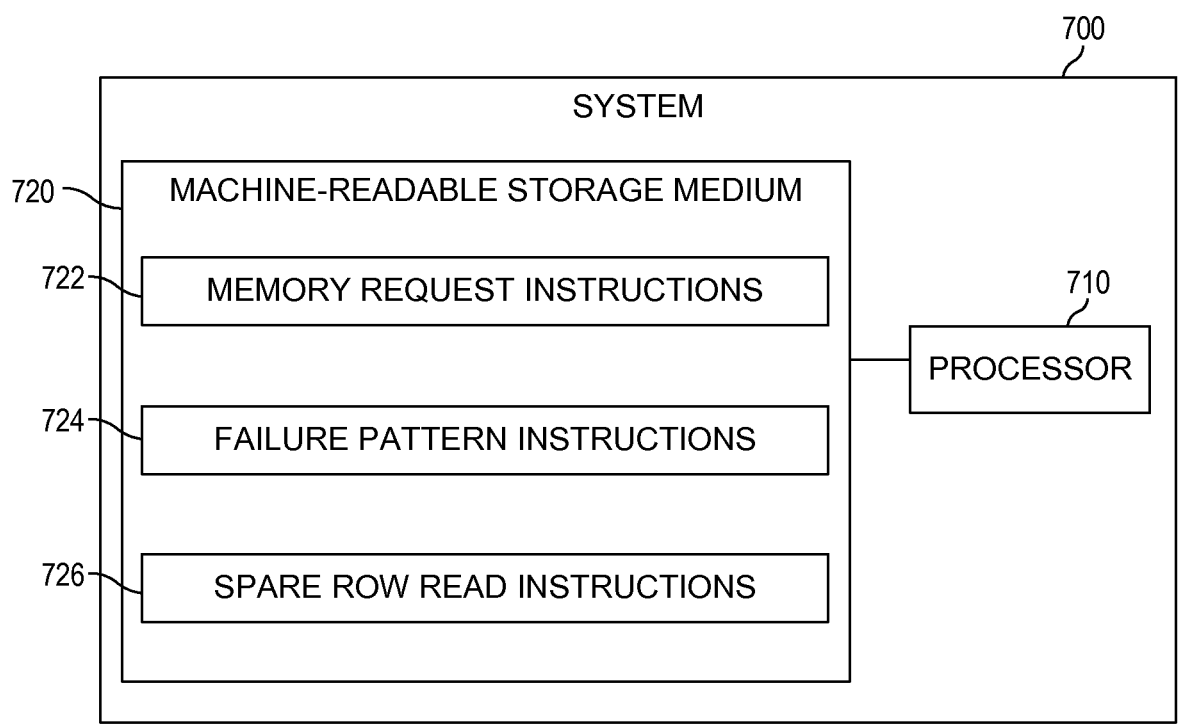
FIG. 7 is a block diagram of an example system for performing fault injection using post-package repair technology.

FIG. 7 is a block diagram of an example system 700 for performing fault injection using post-package repair. System 700 may be similar to system 100 of FIG. 1 or of FIG. 2, for example. In the example of FIG. 7, system 700 includes a processor 710 and a machine-readable storage medium 720. Although the following descriptions refer to a single processor and a single machine-readable storage medium, the descriptions may also apply to a system with multiple processors and multiple machine-readable storage mediums. In such examples, the instructions may be distributed (e.g., stored) across multiple machine-readable storage mediums and the instructions may be distributed (e.g., executed by) across multiple processors.

Processor 710 may be one or more central processing units (CPUs), microprocessors, and/or other hardware devices suitable for retrieval and execution of instructions stored in machine-readable storage medium 720. In the particular example shown in FIG. 7, processor 710 may fetch, decode, and execute instructions 722, 724, 726 to perform fault injection using post-package repair. As an alternative or in addition to retrieving and executing instructions, processor 710 may include one or more electronic circuits comprising a number of electronic components for performing the functionality of one or more of the instructions in machine-readable storage medium 720. With respect to the executable instruction representations (e.g., boxes) described and shown herein, it should be understood that part or all of the executable instructions and/or electronic circuits included within one box may, in alternate examples, be included in a different box shown in the figures or in a different box not shown.

Machine-readable storage medium 720 may be any electronic, magnetic, optical, or other physical storage device that stores executable instructions. Thus, machine-readable storage medium 720 may be, for example, Random Access Memory (RAM), an Electrically-Erasable Programmable Read-Only Memory (EEPROM), a storage drive, an optical disc, and the like. Machine-readable storage medium 720 may be disposed within system 700, as shown in FIG. 7. In this situation, the executable instructions may be "installed" on the system 700. Alternatively, machine-readable storage medium 720 may be a portable, external or remote storage medium, for example, that allows system 700 to download the instructions from the portable/external/remote storage medium. As described herein, machine-readable storage medium 720 may be encoded with executable instructions for injecting a memory failure pattern using post-package repair.

Referring to FIG. 7, memory request instructions 722, when executed by a processor (e.g., 710), may cause system 700 to issue a post-package repair request to a memory controller (e.g., memory controller 104) to remap a row of a memory to a spare row of the memory. The request disassociates the row from an address and associates the spare row (e.g. spare row 116) with the address. Failure pattern instructions 724, when executed by a processor (e.g., 710), may cause system 710 to write a failure pattern to a spare row of a memory using a post-package repair capability of the memory (e.g. system memory 106). Spare row read instructions 726, when executed by a processor (e.g., 710), may cause system 710 issue a read request to the memory controller for the address associated with the spare row (e.g., the address associated with spare row 116).

Figure 8:
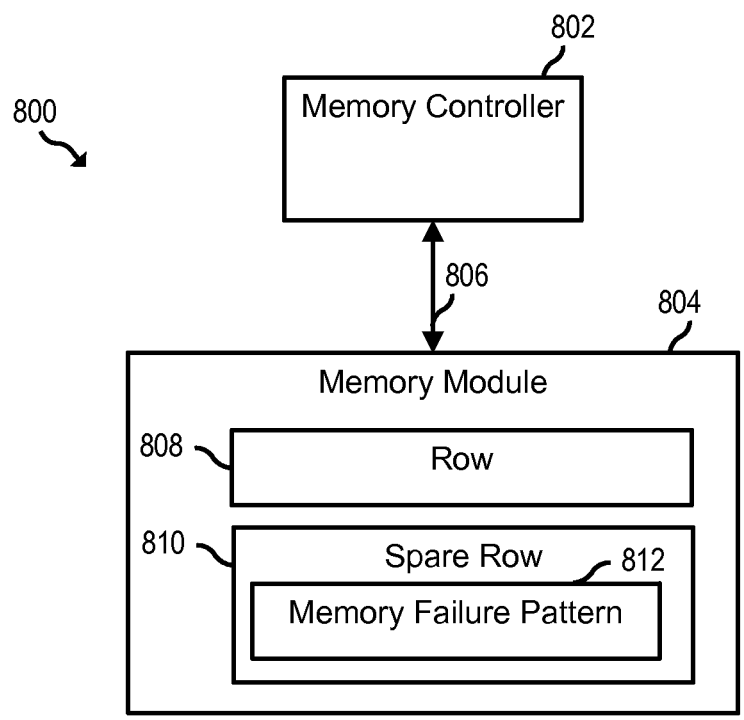
FIG. 8 is a block diagram of an example system for performing fault injection using post-package repair technology.

FIG. 8 is a block diagram of an example system 800 for using post package repair for mapping to a memory failure pattern. System 800 may be similar to system 100 of FIG. 1 or of FIG. 2, for example. In the example of FIG. 8, system 800 includes a memory controller 802, which is connected to a memory module 804 via memory bus 806.

Memory module 804 includes a row 806 and a spare row 810. Spare row 810 includes a memory failure pattern 812. In the example of FIG. 8, memory controller 802 may read, using post-package repair remapping, data from spare row 810 having memory failure pattern 812.

The invention claimed is:

1. A method comprising:
mapping, using post-package repair, an address associated with a first memory row of a computing device to a spare memory row of the computing device,
wherein the spare memory row has a memory failure pattern reading data from the spare memory row; and
generating a write request to an address associated with the spare memory row having the memory failure pattern before reading the data from the spare memory row.

2. The method of claim 1,
changing at least one bit of the memory failure pattern.

3. The method of claim 1,
determining a response of a memory controller to the memory failure pattern; and
comparing the response of the memory controller to a predetermined response to the memory failure pattern.

4. The method of claim 1, further comprising:
mapping the spare memory row of the computing device to a second address of the computing device.

5. The method of claim 1 wherein the memory includes a post-package repair register, wherein the post-package repair register is used to change the memory failure pattern.

6. A system comprising:
a memory comprising a spare row that further includes a failure pattern, a memory controller to:
read, using post-package repair remapping, data from the spare row of the memory having the failure pattern; and
determine whether the failure pattern is correctable or uncorrectable.

7. The system of claim 6, further comprising at least one processor,
wherein responsive to determining the failure pattern is correctable, the at least one processor is further to determine whether the memory controller corrected an error associated with the correctable failure pattern.

8. The system of claim 6, wherein the memory controller is to:
use at least one of hard post-package repair or soft post-package repair responsive to determining that the failure pattern is uncorrectable.

9. The system of claim 6, further comprising at least one processor to:

generate a write request at a particular memory address associated with the spare row; and responsive to generating the write request, generate at least one read request at the address associated with the spare row.

10. The system of claim 6, wherein the memory includes a post-package repair register, wherein the post-package repair register is used to change the failure pattern.

11. The system of claim 6, wherein the failure pattern comprises at least one of: a stuck-at one bit, or a stuck-at zero bit.

12. The system of claim 6, wherein the memory comprises a synchronous dynamic random access memory (SDRAM) module.

13. A non-transitory machine-readable storage medium including instructions stored thereon that, when executed, cause at least one processor to:

issue a post-package repair request to a memory controller to remap a row of a memory to a spare row of the memory, wherein the request disassociates the row from an address and associates the spare row with the address;

write a failure pattern to a spare row of a memory using a post-package repair capability of the memory;

issue a read request to the memory controller for the address associated with the spare row;

determine whether the failure pattern is correctable or uncorrectable.

14. The non-transitory machine-readable storage medium of claim 13, wherein the instructions that cause the at least one processor to issue a post-package repair request to the memory controller further cause the memory controller to issue a post-package repair request to a post-package repair control register of the memory.

15. The non-transitory machine-readable storage medium of claim 13, wherein the instructions cause the at least one processor to determine whether the memory controller corrected an error associated with the correctable failure pattern responsive to determining the failure pattern is correctable, the at least one processor is further.

16. The non-transitory machine-readable storage medium of claim 13, wherein the instructions cause the at least one processor to use at least one of hard post-package repair or soft post-package repair responsive to determining that the failure pattern is uncorrectable.

17. The non-transitory machine-readable storage medium of claim 13, wherein the instructions cause the at least one processor to:

generate a write request at a particular memory address associated with the spare row; and responsive to generating the write request, generate at least one read request at the address associated with the spare row.

18. The non-transitory machine-readable storage medium of claim 13, wherein the memory includes a post-package repair register, and the post-package repair register is used to change the failure pattern.

19. The non-transitory machine-readable storage medium of claim 13, wherein the failure pattern comprises at least one of: a stuck-at one bit, or a stuck-at zero bit.

20. The non-transitory machine-readable storage medium of claim 13, wherein the memory comprises a synchronous dynamic random access memory (SDRAM) module.

* * * * *